US010401416B2

(12) United States Patent
De Rai et al.

(10) Patent No.: US 10,401,416 B2
(45) Date of Patent: Sep. 3, 2019

(54) ELECTRICAL CABLE LINK APPARATUS AND ELECTRICAL CABLE SYSTEM COMPRISING THE APPARATUS

(71) Applicant: PRYSMIAN S.P.A., Milan (IT)

(72) Inventors: Luca Giorgio Maria De Rai, Milan (IT); Roberto Candela, Milan (IT); Antonio Di Stefano, Milan (IT)

(73) Assignee: PRYSMIAN S.P.A, Milan (IT)

(*) Notice: Subject to any disclaimer, the term of this patent is extended or adjusted under 35 U.S.C. 154(b) by 25 days.

(21) Appl. No.: 15/326,284

(22) PCT Filed: Jul. 18, 2014

(86) PCT No.: PCT/EP2014/065518
§ 371 (c)(1),
(2) Date: Jan. 13, 2017

(87) PCT Pub. No.: WO2016/008542
PCT Pub. Date: Jan. 21, 2016

(65) Prior Publication Data
US 2017/0205459 A1 Jul. 20, 2017

(51) Int. Cl.
*G01R 31/08* (2006.01)
*G01R 31/12* (2006.01)
(Continued)

(52) U.S. Cl.
CPC .......... *G01R 31/083* (2013.01); *G01R 31/12* (2013.01); *H02G 15/1055* (2013.01); *H02J 50/10* (2016.02); *G01R 31/1272* (2013.01)

(58) Field of Classification Search
CPC .... G01R 31/83; G01R 31/12; H02G 15/1055; H02J 50/10
See application file for complete search history.

(56) References Cited

U.S. PATENT DOCUMENTS 5,475,312 A * 12/1995 Sedding ................. G01R 31/12
324/536
5,754,045 A * 5/1998 Higuchi .................... H02J 3/00
323/237
(Continued)

FOREIGN PATENT DOCUMENTS

CN           103308832 A      9/2013
KR      10-2010-0047581       5/2010
(Continued)

OTHER PUBLICATIONS

International Search Report from the European Patent Office for International Application No. PCT/EP2014/065518, dated Mar. 31, 2015.
(Continued)

Primary Examiner — Tung X Nguyen
Assistant Examiner — Dominic E Hawkins
(74) Attorney, Agent, or Firm — Finnegan, Henderson, Farabow, Garrett & Dunner, L.L.P.

(57) ABSTRACT

An electrical cable link apparatus includes a first electrical conductor structured to conduct a first electrical current from a first screen portion of a first external electrical cable; an electrical linking module connected to the first electrical conductor and structured to implement a cross-bonding/earting link; a first inductor device inductively coupled to the first electrical conductor and able to generate a supply voltage.

14 Claims, 4 Drawing Sheets

(51) Int. Cl.
*H02G 15/105* (2006.01)
*H02J 50/10* (2016.01)

(56) References Cited

U.S. PATENT DOCUMENTS

| | | | | |
|---|---|---|---|---|
| 6,036,526 | A * | 3/2000 | Alfis, III | H01R 4/70 439/369 |
| 6,737,837 | B1 * | 5/2004 | Halvarsson | G05F 1/70 323/205 |
| 6,895,187 | B1 * | 5/2005 | Webb | H04Q 11/0005 307/126 |
| 2002/0098718 | A1 * | 7/2002 | Harmon | B60D 1/62 439/35 |
| 2004/0011551 | A1 * | 1/2004 | Goehlich | H01B 7/322 174/74 R |
| 2004/0036614 | A1 * | 2/2004 | Goehlich | G01M 3/165 340/604 |
| 2006/0096953 | A1 * | 5/2006 | Halvarsson | H02J 3/1821 218/154 |
| 2007/0256855 | A1 * | 11/2007 | Tarte | H01B 7/08 174/117 F |
| 2010/0071282 | A1 * | 3/2010 | Tofflemire | E04B 2/88 52/173.3 |
| 2011/0251806 | A1 * | 10/2011 | Klapper | H04B 3/546 702/60 |
| 2013/0184891 | A1 * | 7/2013 | Etaati | G06F 1/263 700/295 |
| 2014/0178015 | A1 * | 6/2014 | Tong | G02B 6/4284 385/88 |

FOREIGN PATENT DOCUMENTS

| | | |
|---|---|---|
| KR | 10-0978459 | 8/2010 |
| WO | WO 01/73796 | 10/2001 |

OTHER PUBLICATIONS

Written Opinion of the International Searching Authority from the European Patent Office for International Application No. PCT/EP2014/065518, dated Mar. 31, 2015.

Zhao et al.; "Future Inspection and Monitoring of Underground Transmission Lines", EPRI, pp. i-xiii, to 1-1 to 1-2, 2-1 to 2-14, 3-1 to 3-16, 4-1 to 4-7, 5-1 to 5-7, 6-1 to 6-2, 7-1 and 1, (2009).

Koltunowicz et al.; "PD Monitoring of HV XLPE Cable Lines", Proceedings of the 16$^{th}$ International Symposium on High Voltage Engineering, pp. 1-6, (2009).

* cited by examiner

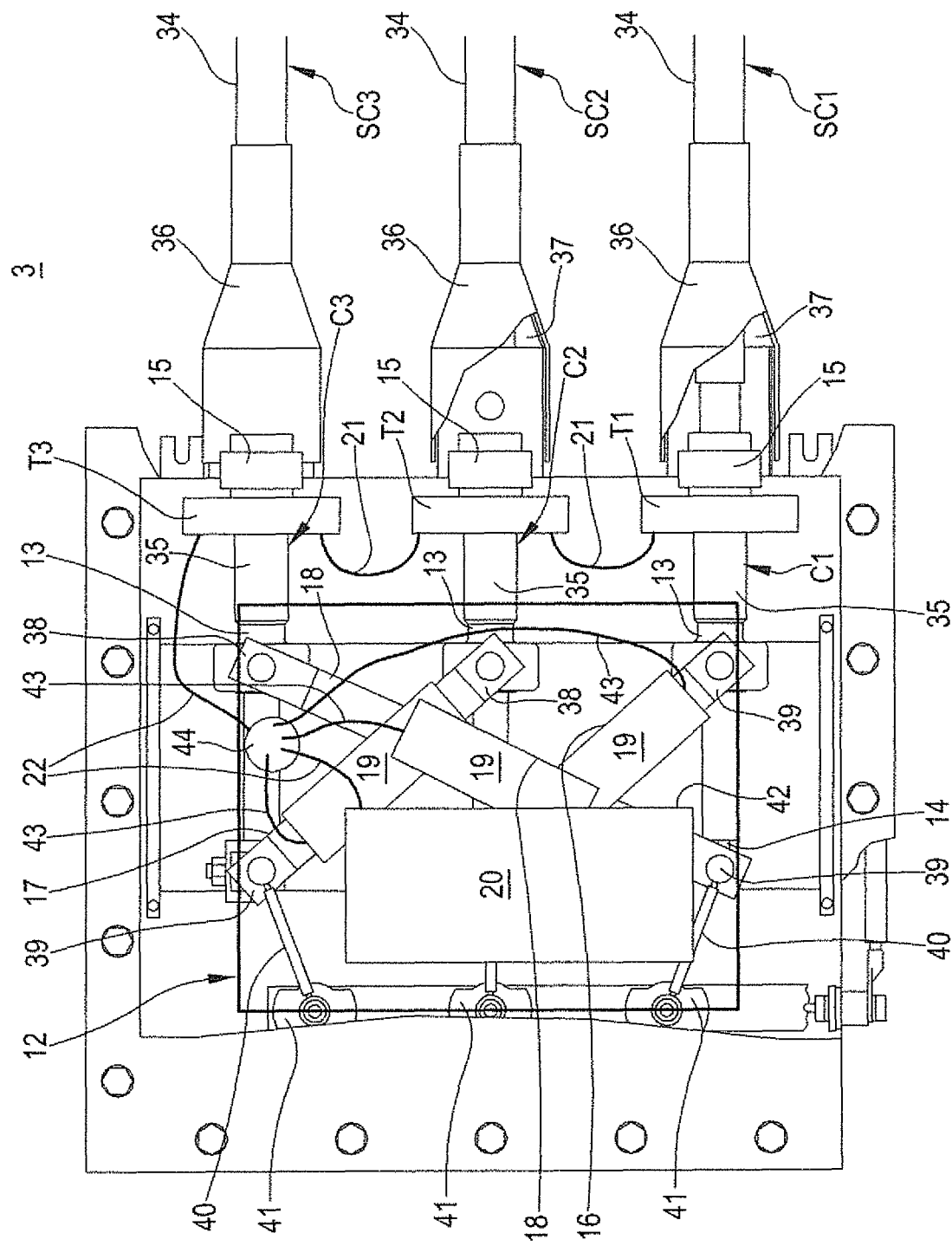

ELECTRICAL CABLE LINK APPARATUS AND ELECTRICAL CABLE SYSTEM COMPRISING THE APPARATUS

CROSS REFERENCE TO RELATED APPLICATION

This application is a national phase application based on PCT/EP2014/065518, filed Jul. 18, 2014, the content of which is incorporated herein by reference.

BACKGROUND

Technical field

The present inventions relate to electrical cable link apparatus and systems and particularly to the link boxes employed to implement earthing link and cross-bonding link.

Description of the Related Art

Link boxes are network components installed near HV (or MV or LV) cable joints and terminations and used to connect their screen conductors together through "cross-bonding" techniques. In particular, in a three-phase high voltage network line, the screens of each cable are cyclically connected such that the totally induced sheaths or screen current adds up to zero (e.g. vector currents) over the entire lengths of the line in order to minimize losses due to the axial induction currents in the metallic screen of each cable.

A typical link box comprises a metal box with a removable top cover and is provided by three lateral openings for screen cables entry, and an external earth connection. During installation, screen cables ends are firstly stripped of from the insulating sheath, inserted inside the lateral openings of the box, then fastened by means of screw terminals to the metal conductors implementing a specific connection scheme.

Document WO-01/73796 describes a three-phase high voltage cable arrangement having a cross-bonded cable screens and cross bonded water sensing wires. There are additional losses caused by the axial induction currents in the metallic screen of a cable. Such additional losses in the cable sheath, screen and other metallic system components can be reduced by grounding of the screens or metal sheaths at one end to avoid providing a closed loop for the induction currents, or by a so-called "cross-bonding" of the cable sheaths or screens to largely compensate the induction voltages such that the screen/sheath current and consequent losses are minimized in spite of the entire arrangement being grounded at both ends.

BRIEF SUMMARY OF THE INVENTION

In underground network, electrical cable link apparatus are the only points accessible by operators for detecting physical/electric parameters on the network by employing electronic sensing devices. Sometimes, these points are positioned in impervious environments (e.g. deserts areas) where power sockets for supplying electric power to these devices are not available.

The Applicant observes that the use of an electrical cable link apparatus to obtain diagnostics information by employing electronic sensing devices finds problems due to the need of providing suitable electric power supply to such sensing devices.

The Applicant has found that the electrical power to be supplied to the electronic sensing device installed in an electrical cable link apparatus can be obtained by inductive coupling with the current flowing in the screen conductors connected to the electrical link apparatus. In this way, it is also possible to have electric power supply even if the network line is disconnected from a load because screen current is always present, despite in this configuration no current circulates in the cable.

According to a first aspect, the present invention relates to an electrical cable link apparatus comprising:
- a first electrical conductor structured to conduct a first electrical current from a first screen portion of a first external electrical cable;
- an electrical linking module connected to the first electrical conductor and structured to implement a cross-bonding/earthing link;
- a first inductor device inductively coupled to the first electrical conductor and able to generate a supply voltage.

Particularly, the first inductor device includes a conductive coil. In accordance with an embodiment, the first inductor device is a toroidal inductor and includes a magnetic core surrounding the first electrical conductor and around which the conductive coil is wound.

Particularly, the apparatus comprises a voltage source connected to the first inductor device to receive a first induced electrical current and provide a corresponding supply voltage, the voltage source comprising a voltage regulator including an AC/DC converter.

In an embodiment, the electrical cable link apparatus comprises a sensor module arranged to receive the supply voltage; the sensor module being configured to detect physical/electric parameters from the electrical linking module. Preferably, the sensor module comprises at least one of the following sensor devices: current sensor, partial discharge sensor, voltage sensor and temperature sensor. Particularly, said partial discharge sensor is one of the following devices: high frequency current transformer HFCT, capacitive coupler, electromagnetic antenna.

Advantageously, the electrical cable link apparatus further comprises an electronic managing module arranged to receive the supply voltage and structured to exchange data/commands with the sensor module.

In accordance with an embodiment, the electrical cable link apparatus further comprises: at least one electrical conductor structured to conduct an electrical current from a screen portion of a second external electrical cable; at least one second inductor device inductively coupled to the at least one electrical conductor to provide an induced electrical current from the electrical current and connected to the first inductor device. Advantageously, the first inductor device and the at least one second inductor device are connected in accordance with one of the following electrical configurations: series configuration, parallel configuration.

In an embodiment, the electrical cable link apparatus further comprises: a second electrical conductor structured to conduct a second electrical current from a second screen portion of the first external electrical cable; a coaxial cable comprising the first electrical conductor and the second electrical conductor (14); wherein the first inductor device is arranged to be inductively coupled with the first and the second electrical conductors.

Advantageously, the electrical cable link apparatus further comprises: a housing having a plurality of walls and a removable cover and structured to accommodate the electrical linking module, the first inductor device and the voltage source. Preferably, the electrical cable link apparatus further comprises at least one electrical cable connector mounted on a wall of the housing to connect the first electrical conductor with an external screen cable connectable to the first screen portion of the first external electrical cable.

According to a second aspect, the present invention relates to an electrical cable system comprising:
- a first screen cable connectable to a first cable screen portion and structured to conduct a first electrical current;
- a second screen cable connectable to a second cable screen portion structured to conduct a second electrical current; and
- an electrical cable link apparatus, comprising:
  - a first electrical conductor connected to the first screen cable;
  - a second electrical conductor connected to the second screen cable;
  - a first inductor device inductively coupled to at least the first electrical conductor to provide and able to generate a supply voltage;
  - an electrical linking module connected to the first and second electrical conductors and structured to implement a cross-bonding/earthing link.

Particularly, said electrical cable system further comprises a sensor module electrical arranged to receive the supply voltage; the sensor module being configured to detect physical/electric parameters from the electrical linking module.

BRIEF DESCRIPTION OF THE DRAWINGS

Further characteristics and advantages will be more apparent from the following description of a preferred embodiment and of its alternatives given as a way of an example with reference to the enclosed drawings in which:

FIGS. 3 and 4 show a lateral section view and a top view of an electrical cable link apparatus employable in the embodiment of FIG. 1.

DETAILED DESCRIPTION

Figure 1:
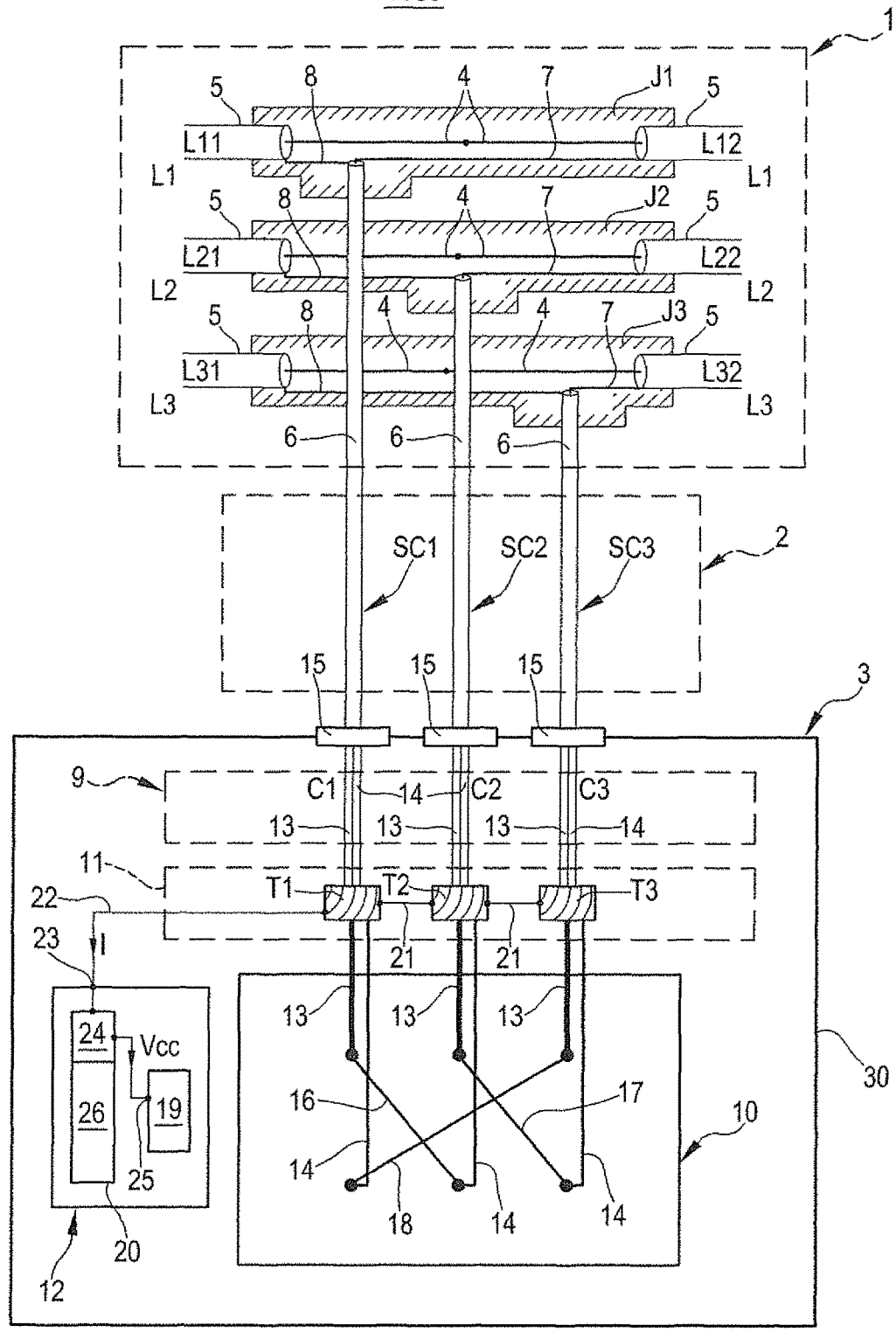
FIG. 1 shows schematically a first embodiment of an electrical cable system comprising an AC electrical power transmission line, a screen conductor line and an electrical cable link apparatus configured to perform a cross-bonding link.

In the following description, same alphanumeric references are used for analogous exemplary elements when they are depicted in different drawings. FIG. 1 shows schematically a first embodiment of an electrical cable system 1000 comprising an AC (Alternate Current) electrical power transmission line 1, a screen conductor line 2 and an electrical cable link apparatus 3.

In accordance with the first embodiment, the electrical power transmission line 1 shows a three-phase configuration and comprises a first electrical cable L1, a second electrical cable L2 and a third electrical cable L3 which can be, as an example, of the high voltage type, each corresponding to a different phase of the system 1000. Particularly, each cable L1-L3 of the electrical power transmission line 1 includes a central conductor element 4 surrounded by an insulation body (not shown) and a metallic screen 5. The screen 5 can have a cross section of 35-50 mm² and has a conductivity of about 0.017.

The screen is generally made of copper but can also comprise a conductive sheath. Each electrical cable L1-L3 of the electrical power transmission line 1 can also include further conductors or insulating layers. The first embodiment illustrated in FIG. 1 refers to an electrical power transmission line 1 for which a so-called "cross-bonding" of cable screens is performed.

In accordance with the example of FIG. 1, the electrical transmission line 1 is provided with a cable joint assembly comprising a first cable joint J1, a second cable joint J2 and a third cable joint J3. Particularly, each cable joint J1-J3 is structured to join the conductor elements 4 of the respective cable L1-L3. As shown in FIG. 1, in the first joint J1 the screen 5 is separated in a first screen portion L11 and a second screen portion L12 of the first cable L1. In the second cable joint J2 the screen 5 is separated into a first screen portion L21 and a second screen portion L22 of the second cable L2. In the third cable joint J2 the screen 5 is separated into a first screen portion L31 and a second screen portion L32 of the third cable L3. Alternatively, instead of joints J1-J2 the cables L1-L3 are connected to respective electrical terminations.

In accordance with the described example, the screen conductor line 2 comprises a first screen cable SC1, a second screen cable SC2 and a third screen cable SC3. The first screen cable SC1 is, as an example, a coaxial cable including: a first tubular conductor 6, connected by a wiring conductor 8 to first screen portion L11 of the first cable L, and a first inner conductor 7, connected to the second screen portion L12 of the first cable L1. The second screen cable SC2 and the third screen cable SC3 are connected to the second cable L2 and the third cable L3, respectively, in a manner analogous to the one above described for the first screen cable SC1. As an example, the first screen cable SC1 comprises an insulator body (not shown) isolating the first inner conductor 7 from the tubular conductor 6 and outer isolating sheath.

In accordance with the illustrated example, the electrical cable link apparatus 3 is a cross-bonding linking box configured to compensate induction voltages such that the screen currents and consequent losses are minimized. In accordance with the schematization of FIG. 1, the electrical cable link apparatus 3 comprises: an internal conductor line 9, an electrical linking module 10 an inductor device 11 inductively coupled to the internal conductor line 9 to provide an electrical power, such as a supply voltage. Particularly, the electrical cable link apparatus 3 is also provided with a voltage source 24 connected to the inductor device 11 and a sensor module 19 connected to the voltage source 24. Particularly, the electrical cable link apparatus 3 can be provided with a housing 30.

The internal conductor line 9 comprises a first internal cable C1 including a second tubular conductor 13 which is a portion of, or is connected to, the first tubular conductor 6 of the first screen cable SC1. The first internal cable C1 also comprises a second inner conductor 14 which is a portion of, or is connected to the first inner conductor 7 of the first screen cable SC1. The internal conductor line 9 also comprises a second internal cable C2, analogous to the first internal cable C1 but which is connected to the second screen cable SC2, and a third internal cable C3, analogous to the first internal cable C1 but which is connected to the third screen cable SC3. The first internal cable C1, the second internal cable C2 and a third internal cable C3 are preferably connected to the first screen cable SC1, the second screen cable SC2 and the third screen cable SC3 by respective pass-through ports or coaxial cable connectors 15. The internal cables C1-C3 allow the currents of the screens 5 of the cables L1-L3 reaching the electrical link module 10. Preferably, each of the internal cables C1-C3 shows a coaxial structure.

In accordance with the embodiment of FIG. 1, the electrical linking module 10 is configured to implement the cross-bonding link by mutually crossing the conductors of the internal cables C1-C3 coming from the phases of the cable system 1000. In accordance with the example schematized in FIG. 1, the electrical linking module 10 comprises a first cross-connecting element 16 (e.g. a rail), a second cross-connecting element 17 and a third cross connecting element 18.

The first cross-connecting element 16 connects the second tubular conductor 13 of the first internal cable C1 with the second inner conductor 14 of the second tubular conductor C2. The second cross-connecting element 17 connects the second tubular conductor 13 of the second internal cable C2 with the second inner conductor 14 of the third tubular conductor C3. The third cross-connecting element 18 connects the second tubular conductor 13 of the third internal cable C3 with the second inner conductor 14 of the first tubular conductor C1. The above described cross-bonding link allows to substantially reduce the losses of currents associated with screen currents of the electrical cables L1, L2 e L3.

Advantageously, the inductor device 11 is inductively coupled with one or more of the conductors of internal cables C1-C3 to generate from the current flowing into said internal cables C1-C3 (received from the screen portions L11, L12, L21, L22, L31, L32 of the external electrical cable L1, L2, L3) at least one output current to be provided to the voltage source 24.

Particularly, the inductor device 11 comprises at least one first inductor T1, such as a conductive coil (i.e. a solenoid), inductively coupled, as an example, with the first internal cable C1. In a preferred embodiment, the first inductor T1 is a toroidal inductor comprising a circular ring-shaped magnetic core around which a conductive coil is wound. The circular ring-shaped magnetic core can be of high magnetic permeability material such as an example, iron powder or ferrite.

In greater detail, the first toroidal inductor Ti is arranged so as to surround at least one conductor among the second tubular conductor 13 and/or the second inner conductor 14 of the first internal cable C1. Particularly, the first toroidal inductor Ti is arranged to act as a secondary circuit of a current transformer wherein the second tubular conductor 13 and/or the second inner conductor 14 acts as a primary circuit: this allows, advantageously, to generate a voltage in the secondary circuit (i.e. the first toroidal inductor T1) related to the current flowing in the primary circuit (i.e. second tubular conductor 13 and/or the second inner conductor 14).

As a matter of fact, it has been found that the current typically circulating in the cable screens and in the corresponding internal cables C1-C3 is in the range of 4÷20 A, and this current value enables to extract from each toroidal inductor a power of about 1÷5 W, sufficient to guarantee the operation of a sensor device connected thereto, such as the partial discharge wireless monitoring device described in EP 2 297 589.

The first toroidal inductor T1 can be designed with a specific primary to secondary transformer ratio according to the amount of expected current flowing into the second tubular conductor 13 and/or the second inner conductor 14 and the expected load associated with the electronic sensing apparatus 12. As an example, considering that the screen currents are in the order of tens of Ampere, the first toroidal inductor T1 can have a coiled wire having a number of coils included in the range 100-1000; the first internal cable C1 is considered to have 1 or 2 coils.

Preferably, the first toroidal inductor T1 surrounds both the second tubular conductor 13 and the second inner conductor 14 of the first internal cable C1 having coaxial structure; this arrangement is particularly advantageous since, due to the cross-bonding link performed, the two currents in the first internal cable C1 partly add up so inducting a greater current in the secondary circuit formed by the first toroidal inductor T1.

In accordance with an example, the inductor device 11 is provided with a second inductor T2 inductively coupled to the second internal cable C2 and/or a third inductor T3 inductively coupled to the third internal cable C3. The second inductor T2 and the third inductor T3 can be analogous to the first inductor T1 and can be coupled to the second internal cable C2 and the third internal cable C3, respectively, in a manner analogous to the one above described with reference to the first internal cable C1. The second inductor T2 and the third inductor T3 allow to generate from the currents flowing into the corresponding internal cables C2-C3 respective output currents. Particularly, the second inductor T2 and the third inductor T3 can be toroidal inductors.

The first T1, the second T2 and the third inductors T3 can be electrically interconnected in series or in parallel so to increase the obtained voltage or current, in accordance with specific needs. FIG. 1 refers to an example in which the coiled wire of the first inductor T1, the second inductor T2 and the third inductor T3 are connected in series by a first connecting wire 21. In accordance with the illustrated example, the coiled wire of the first inductor T3 is connected by a second connecting wire 22 to a first powering terminal 23 of the voltage source 24 to supply an electrical AC current I and a related voltage.

The voltage source 24 can include an AC/DC converter and a DC/DC voltage regulator, preferably provided with overvoltage protections, connected to the powering terminal 23 and configured to receive the electrical voltage associated with the AC electrical current I and supply a DC and stable powering voltage Vcc to a second powering terminal 25 of the sensor module 19. As an example, the voltage source 24 provides an electrical voltage of 12 V to the sensor module 19.

The sensor module 19 is structured to sense electrical or other type of physical parameters detectable into the electrical cable link apparatus 3. Particularly, the sensor module 19 can include one or more of the following sensors: current sensor, partial discharge sensor, voltage sensor and temperature sensor. These sensors can be associated with the three second tubular conductors 13 in the electrical linking module 10.

Preferably, the electrical cable link apparatus 3 can be also provided with a logging (i.e. a data storing component) and monitoring module 26 which can exchange data or control signals with the of the sensor module 19. The logging and monitoring module 26 is powered by the DC/DC voltage regulator 24 and can include a microcontroller or a field-programmable gate array (FPGA).

As an example, the voltage source 24 and the logging and monitoring module 26 can be included into a single case to form a powering and managing module 20. The powering and managing module 20 and the sensor module 19 are schematically shown in FIG. 1 as assembled in an electronic sensing apparatus 12. It is observed that the logging and monitoring module 26 can be internal or external to the housing 30.

Figure 2:
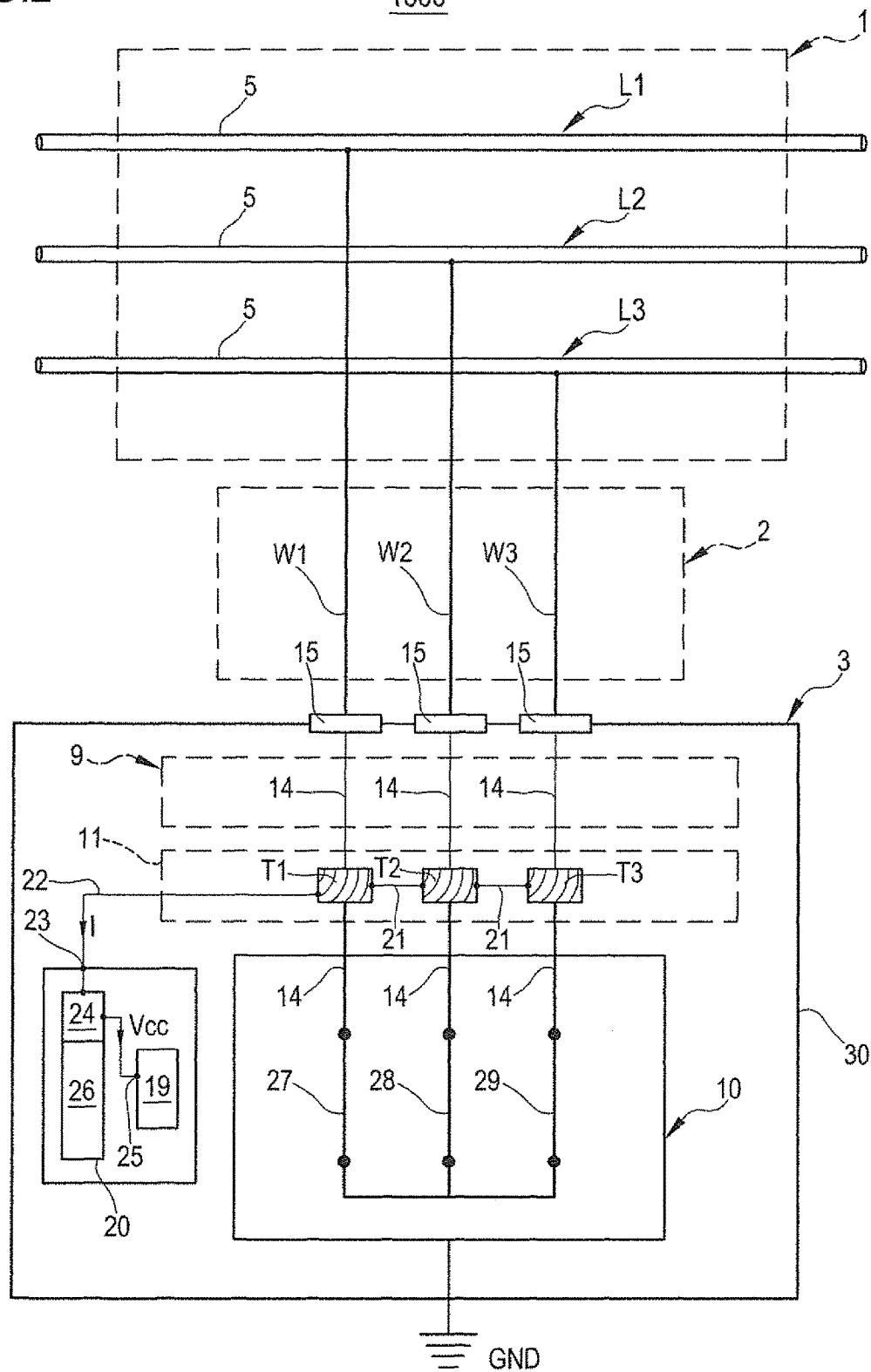
FIG. 2 shows schematically a second embodiment of the electrical cable system comprising an electrical cable link apparatus configured to perform an earthing link.

FIG. 2 refers to a second embodiment of the electrical cable system 1000 which is configured to perform an earthing link. Particularly, the screens 5 of the first cable L1, the second cable L2 and the third cable L3 are connected, by a first screen conductor W1, a second screen conductor W2 and a third screen conductor W3, respectively, to the pass-through ports 15 of the electrical cable link apparatus 3. The screen conductors W1-W3 are particularly made with electrical cables having a non-coaxial structure. In the electrical cable link apparatus 3 of FIG. 2, the second inner conductors 14, which are portions of, or are connected to, the screen conductors W1-W3, are inductively coupled with the inductor device 11. The inductor device 11 can be made in a manner analogous to the one described with reference to FIG. 1.

The electrical linking module 10 of FIG. 2 is configured to implement an earthing link and comprises a first connecting element 27, a second connecting element 28 and a third connecting element 29 (e.g. made by conductive rails) which connect a corresponding second inner conductor 14 to a ground terminal GND. The electronic sensing apparatus 12 and its powering method can be analogous to the ones described with reference to FIG. 1.

A particular embodiment of the electrical linking module 10 of FIG. 1, implementing a cross-bonding link, will be now described with reference to FIG. 3 and FIG. 4. The housing 30 of the electrical linking module 10 is a box made, as an example, of metal and is provided with a removable top cover 31, a base 49 and four lateral walls 32. The removable top cover 31 can be fixed to the walls 32 by one or more nut-and-bolt assemblies 33.

One of the lateral walls 32 is provided with the coaxial cable connectors 15 structured to connect the screen cables SC1-SC3 with the internal cable C1-C3. As an example, one of the coaxial cable connectors 15 is structured to connect the first tubular conductor 6 and the first inner conductor 7 (FIG. 1) of the first screen cable SC1 to the second tubular conductor 13 and second inner conductor 14 of the first internal cable C1, respectively. FIGS. 3 and 4 also show an outer sheet 34 of the screen cables SC1-SC3 and a further outer sheet 35 of the internal cables C1-C3. Moreover, hot shrinkable tubes 36 filled in with a resin compound 37 can be provided to fix each screen cable SC1-SC3 to the corresponding coaxial cable connectors 15.

Preferably, the coaxial cable connectors 15 are chosen so as to withstand the maximum link box voltage and current rating, and guarantee a good mechanical stability and reliability, an easy and fast mating (connection) procedure and a fast installation on the cable ends. More preferably, the coaxial cable connectors 15 show an high protection degree with regard to water and dust. As an example, the coaxial cable connectors 15 can show a structure similar to common coaxial cable connectors (e.g. Bayonet Neill Concelman, BNC; N-Type; F-type; etc.) but with adequate dimensions. In order to guarantee a perfect sealing, a resin casting can be applied upon the connectors.

In accordance with the shown example, each toroidal inductor T1-T3 surrounds a segment of the internal cables C1-C3 and an inside portion of the respective coaxial cable connectors 15. Moreover, the electrical linking module 10 comprises three first interconnecting terminals 38 which connects each one of the second tubular conductors 13 to a first end of the respective cross-connecting element 16-18. The electrical linking module 10 also includes three second interconnecting terminals 39 which connect each one of the second inner conductors 14 to a second end of the respective cross-connecting element 16-18. FIG. 3 also shows an insulating sheath 48 coating the inner conductors 14.

Moreover, each second interconnecting terminal 39 is connected, by a respective connection wire 40, to a corresponding transient voltage suppressor device 41 configured to put the second interconnecting terminal 39 in contact with a ground terminal if the electrical voltage on the respective second interconnecting terminal 39 overcomes a threshold value. This situation can occur because of faults (due, for example, to lightning) causing overvoltage in the cable screens 5.

The first interconnecting terminals 38 and the second interconnecting terminals 39 are supported by a base structure 45 which is sunk in a pouring hardened resin compound 46 filling a region extending from an internal wall 47 and the lateral wall 32 wherein the coaxial cable connectors 15 are arranged. The pouring resin compound allows to insulate and seal housing 30 from water.

Figure 3:
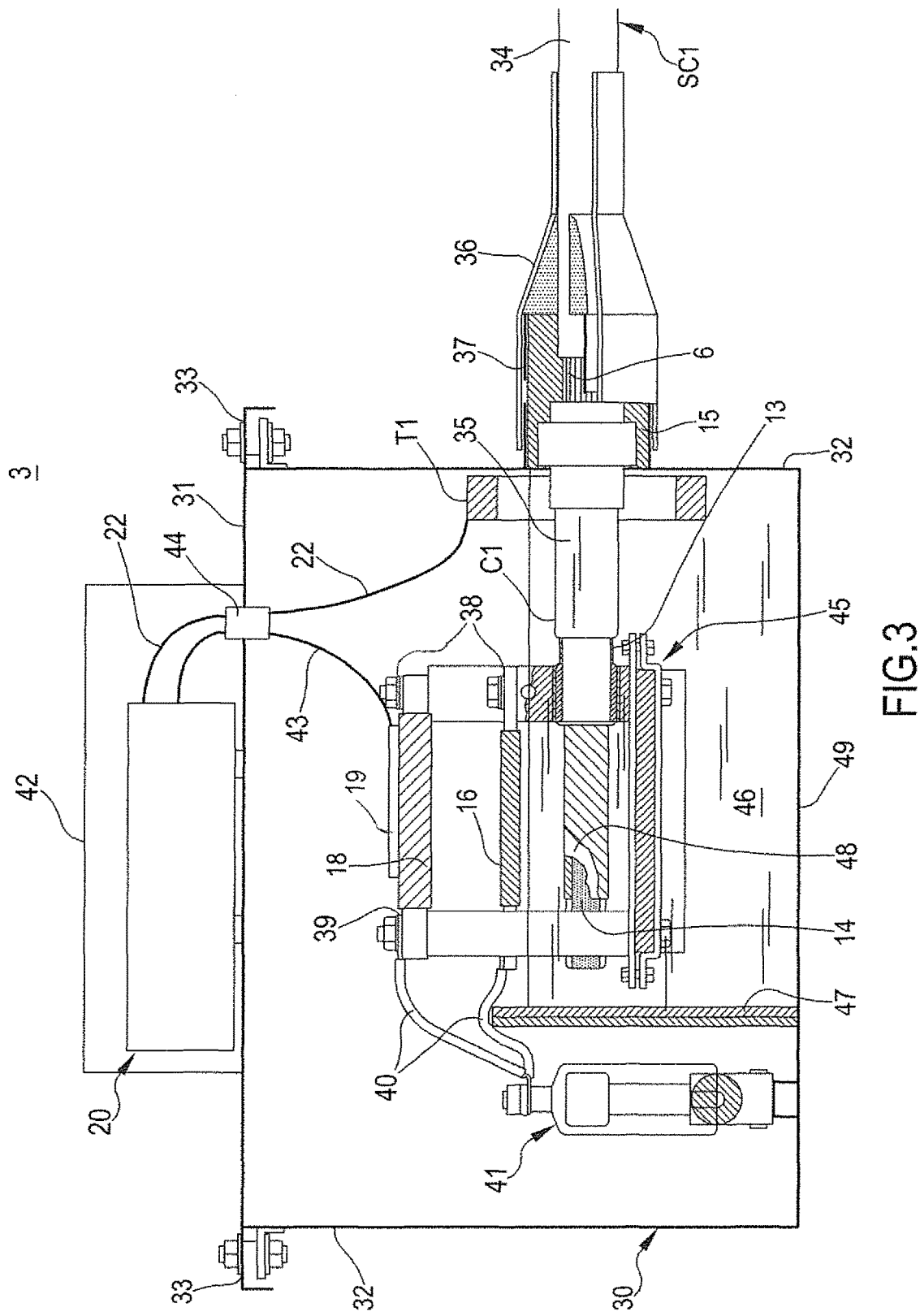

According to the example shown in FIGS. 3 and 4, the powering and managing module 20 is housed in a respective case 42 external to the housing 30. FIGS. 3 and 4 also illustrates, a pass-through port 44 allowing connection of the powering and managing module 20 with the first inductor Ti via the second connecting wire 22 and with the three sensor modules 19, each placed on a respective cross-connecting element 16-18, by means of further connecting wires 43.

As an example, the case 42 is a plastic enclosure separated from the housing 30 and fixable to the top cover 31; the plastic enclosure avoids shielding of a radio communication equipment which can be housed in the powering and managing module 20. Alternatively, the case 42 can be preformed in the top cover 31 itself, so to create a protruding volume.

Different kind of sensors can be connected to the internal screen conductors to monitor specific diagnostic quantities but in accordance with an example, each sensor module 19 of FIGS. 3 and 4 is a partial discharge (PD) sensor, since the screen conductors coming from the joints or terminals carries also the potential partial discharge current. Partial discharge sensors can be implemented either as high frequency current transformers (HFCT), capacitive couplers, or electromagnetic (antenna) sensors.

Another parameter which can be detected from the electrical cable link apparatus 3 is the screen current flowing in the screens 5. This current can be sensed by means of a small current transformers or Hall effect sensor included into the sensor module 19. Also screen voltage can be monitored as well as temperature if required.

With reference to the installation of the electrical cable link apparatus 3, the hot shrinkable tubes 36 is applied to the screen cables SC1-SC3 which are inserted into the corresponding coaxial cable connectors 15. Subsequently, the hot shrinkable tubes 36 are made to shrink so as to fix each screen cables SC1-SC3 to the corresponding coaxial cable connector 15. The electrical and electronic components placed inside the electrical cable link apparatus 3 are preferably pre-installed as described above and so no further steps are required during installation to perform their electrical connections.

The described electrical cable link apparatus 3 allows extracting electrical energy, and so feeding the electronic sensing apparatus 12, from the electrical current flowing in the screen cables SC1-SC3 (or the screen conductors W1-W3) which reach the apparatus 3 itself to implement a particular electrical link. Thus, a separated powering system configured to supply electrical energy to sense and monitor electrical devices placed into the electrical cable link apparatus 3 is not necessary and electrical energy consumption is reduced. This allows exploiting the electrical cable link apparatus 3 for diagnostic purposes in a very efficient manner.

Moreover, the example of the electrical cable link apparatus 3 described with reference to FIGS. 3 and 4 is particularly advantageous since it requires very easy installation procedure and offers high protection degree with regard to water and dust.

The invention claim is:

1. An electrical cable link apparatus, comprising:
 a coaxial cable, the coaxial cable comprising:
  a first electrical conductor structured to conduct a first electrical current from a first screen portion of a first external electrical cable; and
  a second electrical conductor structured to conduct a second electrical current from a second screen portion of the first external electrical cable;
 an electrical linking module connected to the coaxial cable and structured to implement a cross-bonding link; and
 a first inductor device inductively coupled to the coaxial cable, the first inductor device being able to generate a supply voltage.

2. The apparatus of claim 1, wherein the first inductor device comprises a conductive coil.

3. The apparatus of claim 2, wherein the first inductor device is a toroidal inductor and comprises a magnetic core surrounding the first electrical conductor and the second electrical conductor around which the conductive coil is wound.

4. The apparatus of claim 1, comprising a voltage source connected to the first inductor device to receive a first induced electrical current and provide a corresponding supply voltage, the voltage source comprising a voltage regulator comprising an AC/DC converter.

5. The apparatus of claim 1, further comprising a sensor module arranged to receive the supply voltage, the sensor module being configured to detect physical/electric parameters from the electrical linking module.

6. The apparatus of claim 5, wherein the sensor module comprises at least one of the following sensor devices: current sensor, partial discharge sensor, voltage sensor and temperature sensor.

7. The apparatus of claim 6, wherein the partial discharge sensor is one of the following devices: high frequency current transformer, capacitive coupler, and electromagnetic antenna.

8. The apparatus of claim 5, further comprising an electronic managing module arranged to receive the supply voltage and structured to exchange data/commands with the sensor module.

9. The apparatus of claim 1, further comprising:
 at least one electrical conductor structured to conduct an electrical current from a screen portion of a second external electrical cable; and
 at least one second inductor device inductively coupled to the at least one electrical conductor to provide an induced electrical current from the electrical current and connected to the first inductor device.

10. The apparatus of claim 9, wherein the first inductor device and the at least one second inductor device are connected in accordance with one of the following electrical configurations; series configuration, and parallel configuration.

11. The apparatus of claim 4, further comprising:
 a housing having a plurality of walls and a removable cover and structured to accommodate the electrical linking module, the first inductor device and the voltage source.

12. The apparatus of claim 11, further comprising at least one electrical cable connector mounted on a wall of the housing to connect the first electrical conductor with an external screen cable connectable to the first screen portion of the first external electrical cable.

13. An electrical cable system, comprising:
 a first coaxial screen cable connectable to a first cable screen portion to conduct a first electrical current and to a second cable screen portion to conduct a second electrical current;
 a second coaxial screen cable connectable to a third cable screen portion to conduct a third electrical current and to a fourth cable screen portion to conduct a second electrical current; and
 an electrical cable link apparatus, comprising:
  a coaxial cable comprising: a first electrical conductor connected to the first cable screen portion and a second electrical conductor connected to the second cable screen portion;
  an additional coaxial cable comprising: a third electrical conductor connected to the third cable screen portion and a fourth electrical conductor connected to the fourth cable screen portion;
  a first inductor device inductively coupled to at least the coaxial cable and able to generate a supply voltage; and
  an electrical linking module connected to the coaxial cable and the additional coaxial cable and structured to implement a cross-bonding link.

14. The system of claim 13, further comprising:
 a sensor module arranged to receive the supply voltage, the sensor module being configured to detect physical/electrical parameters from the electrical linking module.

* * * * *